US 12,282,264 B2

(12) United States Patent
Ko et al.

(10) Patent No.: US 12,282,264 B2
(45) Date of Patent: Apr. 22, 2025

(54) CLEANING APPARATUS FOR CLEANING SURFACE OF PHOTOMASK

(71) Applicant: TAIWAN SEMICONDUCTOR MANUFACTURING COMPANY LIMITED, Hsin-Chu (TW)

(72) Inventors: Ting-Hsien Ko, Tainan (TW); Chih-Wei Wen, Tainan (TW); Chung-Hung Lin, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 914 days.

(21) Appl. No.: 17/308,308

(22) Filed: May 5, 2021

(65) Prior Publication Data

US 2022/0357678 A1 Nov. 10, 2022

(51) Int. Cl.
*G03F 7/00* (2006.01)
*B08B 5/02* (2006.01)

(52) U.S. Cl.
CPC ............ *G03F 7/70925* (2013.01); *B08B 5/02* (2013.01)

(58) Field of Classification Search
CPC ......... B08B 5/023; B08B 5/026; B08B 5/043; B08B 5/046; B08B 5/02
See application file for complete search history.

(56) References Cited

U.S. PATENT DOCUMENTS

| 2007/0281094 A1* | 12/2007 | Nishio | .................... B08B 5/023 |
| | | | 15/300.1 |
| 2010/0071728 A1* | 3/2010 | Oh | .................... H01L 21/67051 |
| | | | 134/49 |
| 2018/0204743 A1* | 7/2018 | Otsuji | ............... H01L 21/67023 |

FOREIGN PATENT DOCUMENTS

| CN | 109047068 A | * 12/2018 | ............. B08B 5/023 |
| KR | 100644212 B1 | * 11/2006 | ............. B08B 5/043 |

OTHER PUBLICATIONS

CN109047068A (machine translation) (Year: 2018).*
KR100644212 B1 (machine translation) (Year: 2006).*

* cited by examiner

Primary Examiner — Andrew A Horton
(74) Attorney, Agent, or Firm — Cooper Legal Group, LLC

(57) ABSTRACT

A cleaning apparatus for cleaning a surface of a photomask includes a housing defining a chamber, a photomask holder disposed within the chamber, and a gas dispenser disposed within the chamber to direct gas toward the photomask holder. The gas dispenser has two or more gas dispensing outlets. A driver is coupled to at least one of the photomask holder or the gas dispenser to establish relative movement between the photomask holder and the gas dispenser.

20 Claims, 7 Drawing Sheets

CLEANING APPARATUS FOR CLEANING SURFACE OF PHOTOMASK

BACKGROUND

Semiconductor devices comprise precisely defined and positioned features, such as implant regions, isolation regions, components, interconnects, or other features. Many semiconductor device manufacturing processes, such as microfabrication, include utilizing photolithography to precisely define and position semiconductor device features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
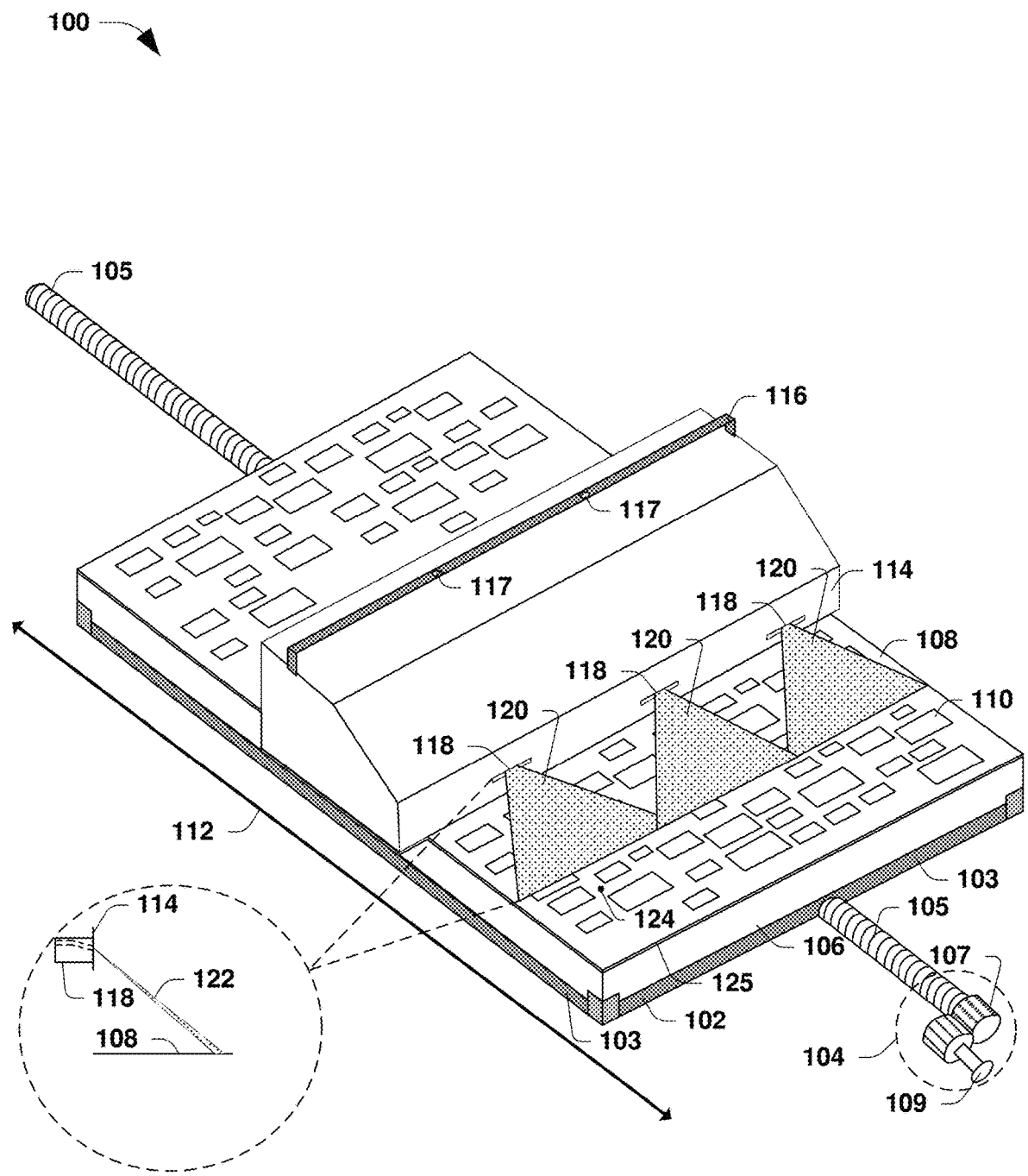
FIGS. 1-5 are illustrations of a cleaning apparatus for cleaning a surface of a photomask, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more cleaning apparatuses for cleaning the surface of a photomask are described herein. A cleaning apparatus includes a gas dispenser, a vacuum, or a particle remover having both a gas dispenser and a vacuum. The gas dispenser described herein dispenses two or more gas-knives toward the surface of the photomask at a forward angle. The gas-knives contact the surface of the photomask and drive particle(s) on the photomask in the forward direction as the photomask is driven relative to the gas dispenser. The particle(s) are driven by the gas-knives beyond a ledge portion of the photomask to thereby remove the particle(s) from the surface of the photomask. Because the gas-knives displace the particle(s) in a forward direction, the particle(s) are driven forward rather than downward into the surface of the photomask. Other photomask cleaning apparatuses such as wet-clean devices dispense a fluid in a downward vertical direction toward the surface of the photomask whereby particle(s) might be pressed into and/or damage the surface of the photomask. Thus, the cleaning apparatus of the disclosure has less potential to damage the surface of a photomask compared to other photomask cleaning apparatuses.

The vacuum described herein includes two or more vacuum pores hermetically coupled to a vacuum pressure source. The vacuum pressure source creates vacuum pressure flux into the pores. The vacuum, and hence the two or more vacuum pores, is driven relative to the photomask to remove particles from the surface of the photomask. The vacuum pressure into the two or more vacuum pores generates increased vacuum flux compared to vacuums that have a single open vacuum slit. The increased vacuum flux generated due to the two or more vacuum pores provides greater vacuum force into the vacuum compared to vacuums having a single open vacuum slit. Thus, the cleaning apparatus of the disclosure is more effective at suctioning particles off the surface of a photomask compared to other photomask cleaning apparatuses.

The particle remover described herein can include both a gas-knife dispenser and a vacuum having two or more vacuum pores. The two or more vacuum pores are proximate an area where a gas-knife contacts the surface of the photomask. The particle remover, and hence the gas-knife and the two or more vacuum pores, is driven relative to the photomask to remove particles from the surface of the photomask. The combination of the gas-knife dispenser and the vacuum increase particle removal efficacy compared to other photomask cleaners such as wet-clean devices and/or single open slit vacuums.

Figure 2:
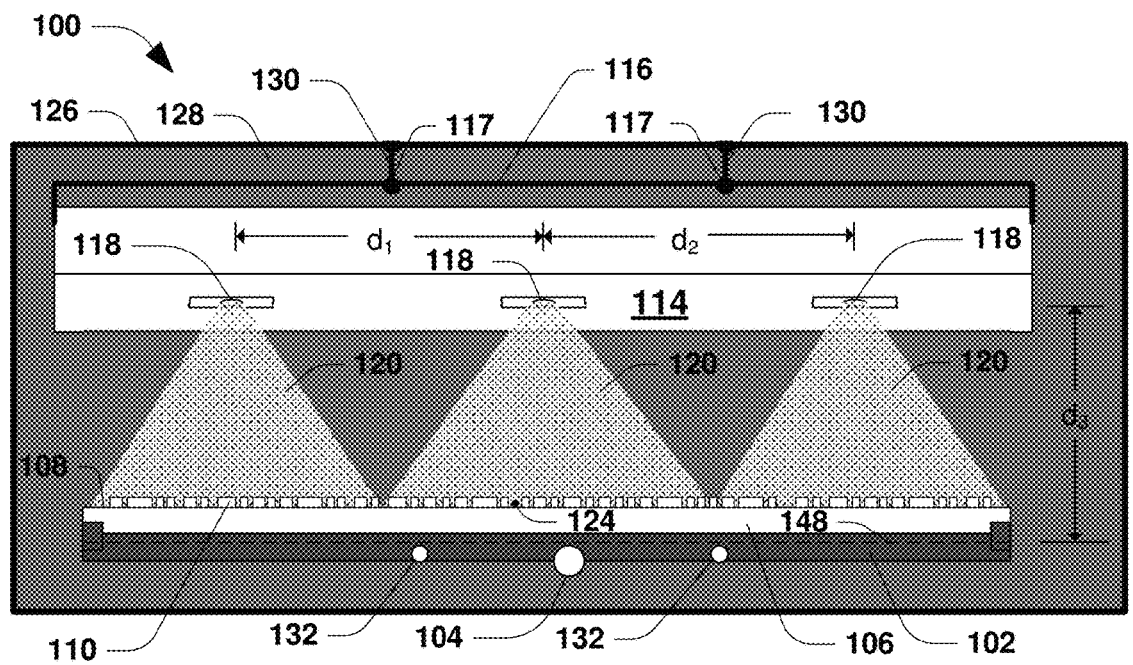
Figure 3:
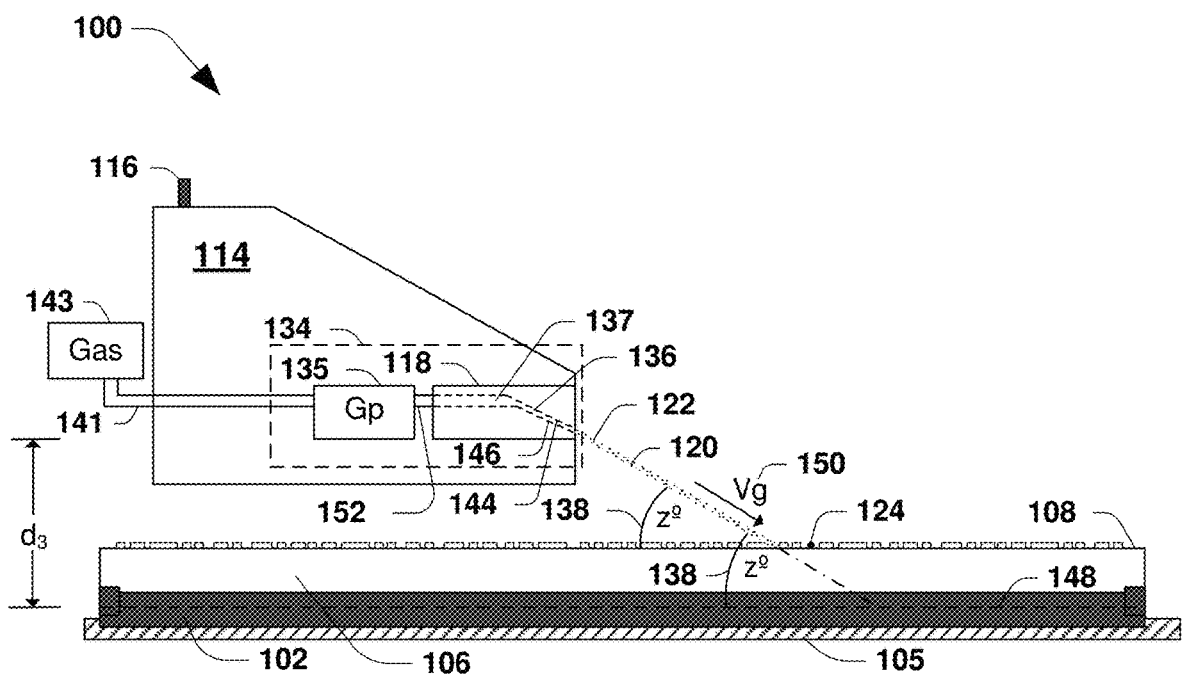

FIGS. 1-5 are illustrations of a cleaning apparatus for cleaning a surface of a photomask, according to some embodiments. In addition to depicting the cleaning apparatus, each of FIGS. 1-3 depicts the photomask to provide context to features of the disclosed cleaning apparatus. The depiction of the photomask is not to be construed as a component and/or limitation of the disclosed cleaning apparatus.

Turning to FIG. 1, a cleaning apparatus 100 for cleaning a surface 108 of a photomask 106, such as by removing particles 124 or contaminants from the surface 108, comprises a photomask holder 102. According to some embodiments, the photomask holder 102 comprises a top surface 148 (referenced in FIG. 2) to vertically support the photomask 106 and side surfaces 103 to inhibit shifting of the photomask 106 while the surface 108 of the photomask 106 is cleaned by the cleaning apparatus 100. The side surfaces 103 may be dimensioned to inhibit shifting of the photomask 106 within an area defined by the side surfaces 103. The photomask holder 102 may comprise one or more of mechanical, electrical, magnetic, or other types of devices to inhibit shifting of the photomask 106 while the surface 108 is cleaned. Other configurations of the photomask holder 102 are within the scope of the present disclosure.

The cleaning apparatus 100 comprises a gas dispenser 114 disposed over the photomask holder 102. At least one of the photomask holder 102 or the gas dispenser 114 is coupled to a driver, such as driver 104, to generate relative movement 112 between the photomask holder 102 and the gas dispenser 114 while the surface 108 is cleaned. In some embodiments, a rate of the relative movement between the photomask holder 102 and the gas dispenser 114 is 5 centimeters per second. Other rates of relative movement are within the scope of the present disclosure.

According to some embodiments, the photomask holder 102 is coupled to the driver 104 and the gas dispenser 114 is coupled to a second driver (not illustrated) for conveying both the photomask holder 102 and the gas dispenser 114 relative to one another while the surface 108 is cleaned. In some embodiments, one of the photomask holder 102 or the gas dispenser 114 comprises a mounting fixture 116. The mounting fixture 116 defines mounting holes 117 for mounting the photomask holder 102 or the gas dispenser 114 to a fixed structure to keep stationary one of the photomask holder 102 or the gas dispenser 114 while the other of the photomask holder 102 or the gas dispenser 114 is conveyed while the surface 108 is cleaned.

The driver 104 comprises one or more of mechanical, electrical, or magnetic conveying devices. In some embodiments, the driver 104 comprises a threaded shaft 105, a gear 107, and a driver (partially shown) 109. The threads of the threaded shaft 105 are coupled to a threaded portion (not shown) of the photomask holder 102. The torque generated by the driver 109 thereby conveys the photomask holder 102 relative to the position of the gas dispenser 114. Other configurations for establishing relative movement 112 between the photomask holder 102 and the gas dispenser 114 are within the scope of the present disclosure.

The gas dispenser 114 comprises two or more gas dispensing outlets 118 to dispense a gas 120 onto the surface 108 of the photomask 106. The gas 120 may comprise air or other gas or mixture of gasses. The two or more gas dispensing outlets 118 are configured to dispense a narrow stream of gas, referred to as a gas-knife 122, onto the surface 108. Relative movement between the photomask holder 102 and the gas dispenser 114 causes the gas-knife 122 to contact and, due to the velocity of the gas 120, remove particles 124 from the surface 108 by propelling the particles 124 along the surface 108 in the direction of gas flow and beyond patterned areas 110 of the photomask 106. In some embodiments, the cleaning apparatus 100 is configured such that the gas-knife 122 propels the particles 124 beyond a ledge portion 125 of the photomask 106. Other configurations for dispensing the gas 120 onto the surface 108 are within the scope of the present disclosure.

Referring to FIG. 2, the cleaning apparatus 100 comprises a housing 126 defining a chamber 128. In some embodiments, mounts 130 are coupled to the housing 126 and the mounting fixture 116. The cleaning apparatus 100 may comprise a driving mechanism (not shown) configured to convey the mounts 130 to establish the relative movement 112 between the photomask holder 102 and the gas dispenser 114. In some embodiments, the mounts 130 are fixed in place and maintain the gas dispenser at a fixed location within the chamber 128. In some embodiments, the cleaning apparatus 100 comprises guide rods 132 through the photomask holder 102 to maintain a fixed orientation of the photomask holder 102 relative to the gas dispenser 114. Other configurations for mounting the gas dispenser 114 in the chamber 128 are within the scope of the present disclosure.

According to some embodiments, a first gas dispensing outlet and a second gas dispensing outlet of the two or more gas dispensing outlets 118 are separated by a first distance $d_1$, and the second gas dispensing outlet and a third gas dispensing outlet of the two or more gas dispensing outlets 118 are separated by a second distance $d_2$. The first distance $d_1$ may be the same as or different than the second distance $d_2$. In some embodiments, the first distance $d_1$ and the second distance $d_2$ are each within a range of 4-10 millimeters. A vertical distance $d_3$ between the top surface 148 and at least one of the two or more gas dispensing outlets 118 may be the same as, less than, or greater than the first distance $d_1$ or the second distance $d_2$. In some embodiments, a vertical distance between one gas dispensing outlet and the top surface 148 may be the same as, less than, or greater than a vertical distance between a different gas dispensing outlet and the top surface 148. In some embodiments, the vertical distance $d_3$ is within a range of 2-6 millimeters. Other distances $d_1$, $d_2$, and/or $d_3$ are within the scope of the present disclosure.

Referring to FIG. 3, the gas dispenser 114 comprises two or more gas flow generators 134. Each gas flow generator of the two or more gas flow generators 134 comprises a gas dispensing outlet of the two or more gas dispensing outlets 118. In some embodiments, at least some of the two or more gas flow generators 134 comprise a respective pressurized gas chamber Gp 135. At least one pressurized gas chamber Gp 135 is coupled to the two or more gas dispensing outlets 118. In some embodiments, one pressurized gas chamber Gp 135 is coupled to each of the two or more gas flow generators 134. The pressurized gas chamber Gp 135 may be hermetically coupled to a gas source 143 via a gas source conduit 141. Other configurations for generating gas flow are within the scope of the present disclosure.

Each of the two or more gas dispensing outlets 118 comprises surfaces, such as a first surface 144 and a second surface 146, defining at least one gas dispensing conduit 136 hermetically coupled to the pressurized gas chamber Gp 135. A first gas source conduit 152 and a second gas source conduit 137 may hermetically couple the at least one gas dispensing conduit 136 to the pressurized gas chamber Gp 135. The gas dispensing conduit 136 is directed toward the top surface 148. According to some embodiments, an angle z° 138 of the first surface 144 with respect to the top surface 148 of the photomask holder 102 is within a range of 30° to 60°. Accordingly, the gas-knife 122 is projected from the gas dispensing conduit 136 at an angle z° 138 within a range of 30° to 60° with respect to the surface 108. Other angles of the first surface 144 and the second surface 146 are within the scope of the present disclosure.

In some embodiments, the pressure of the gas 120 exiting the pressurized gas chamber Gp 135 and the cross-sectional area of the gas dispensing conduit 136 define a velocity Vg 150 of the gas 120 of the gas-knife 122. The velocity Vg 150 of the gas 120 may be increased by increasing the pressure of the gas 120 exiting the pressurized gas chamber Gp 135 and/or by decreasing the cross-sectional area of the gas dispensing conduit 136. Conversely, the velocity Vg 150 of the gas 120 may be decreased by decreasing the pressure of the gas 120 exiting the pressurized gas chamber Gp 135 and/or by increasing the cross-sectional area of the gas dispensing conduit 136. According to some embodiments, a velocity Vg 150 of the gas 120 dispensed from a gas dispensing outlet of the two or more gas dispensing outlets 118 is a velocity within a range of 10 meters-per-second to 20 meters-per-second. The velocity Vg 150 of the gas 120 dispensed from some of the two or more gas dispensing outlets 118 may be different than the velocity Vg 150 of the gas 120 dispensed from other of the two or more gas dispensing outlets 118. Other configurations for defining the velocity Vg 150 of the gas 120 are within the scope of the present disclosure.

Figure 4:
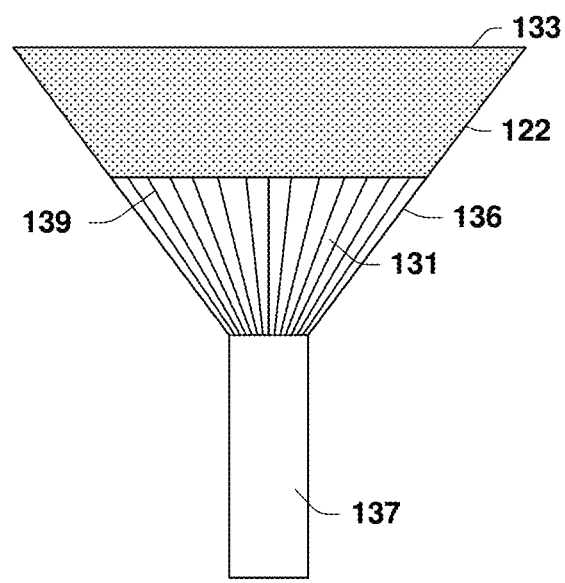

Referring to FIG. 4, in some embodiments the at least one gas dispensing conduit 136 comprises channel surfaces 139 defining two or more gas dispensing channels 131. The gas dispensing channels 131 may be directed in forward (toward the surface 108) and angled directions to shape the gas-knife 122, such as by adjusting spacing, configuration, etc. between the first surface 144 and the second surface 146 and/or widening a contact portion 133 of the gas-knife 122. Other configurations of the at least one gas dispensing conduit 136 are within the scope of the present disclosure.

Figure 5:
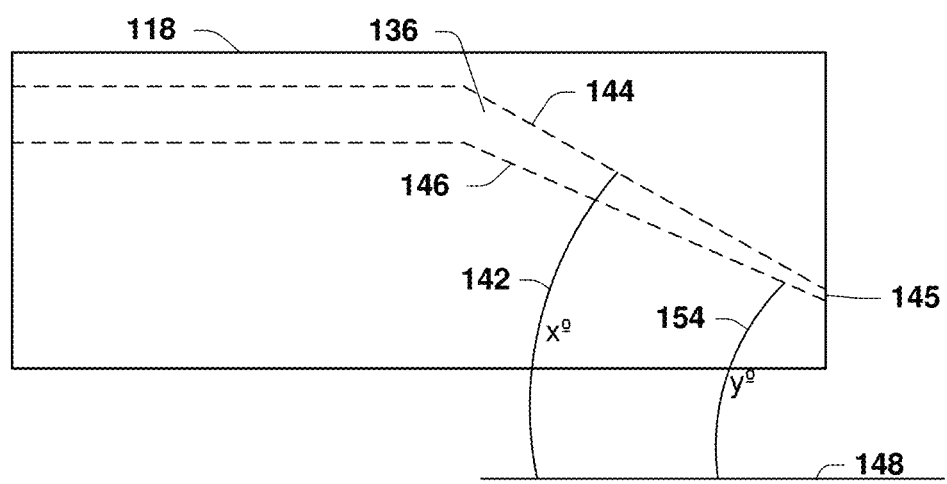

Referring to FIG. 5, in some embodiments a first angle x° 142 of the first surface 144 with respect to the top surface 148 of the photomask holder 102 is different than a second angle y° 154 of the second surface 146 with respect to the top surface 148 of the photomask holder 102. In some embodiments, the first angle x° 142 is greater than 30°, and the second angle y° 154 is less than 60°. In some embodiments, at least one of the first angle x° 142 or the second angle y° 154 vary in a direction into/out of the page, such that a distance or spacing between the first surface 144 and the second surface 146 varies in the direction into/out of the page. At a first location into/out of the page the first surface 144 is separated from the second surface 146 by a first distance and at a second location into/out of the page the first surface 144 is separated from the second surface 146 by a second distance different than the first distance. Such variations can alter, shape, configure, etc. a mouth 145 or point at which the gas is emitted from the gas dispensing conduit 136, such as to control a corresponding gas-knife. Other configurations and angles of the first surface 144 and the second surface 146 are within the scope of the present disclosure.

Figure 6:
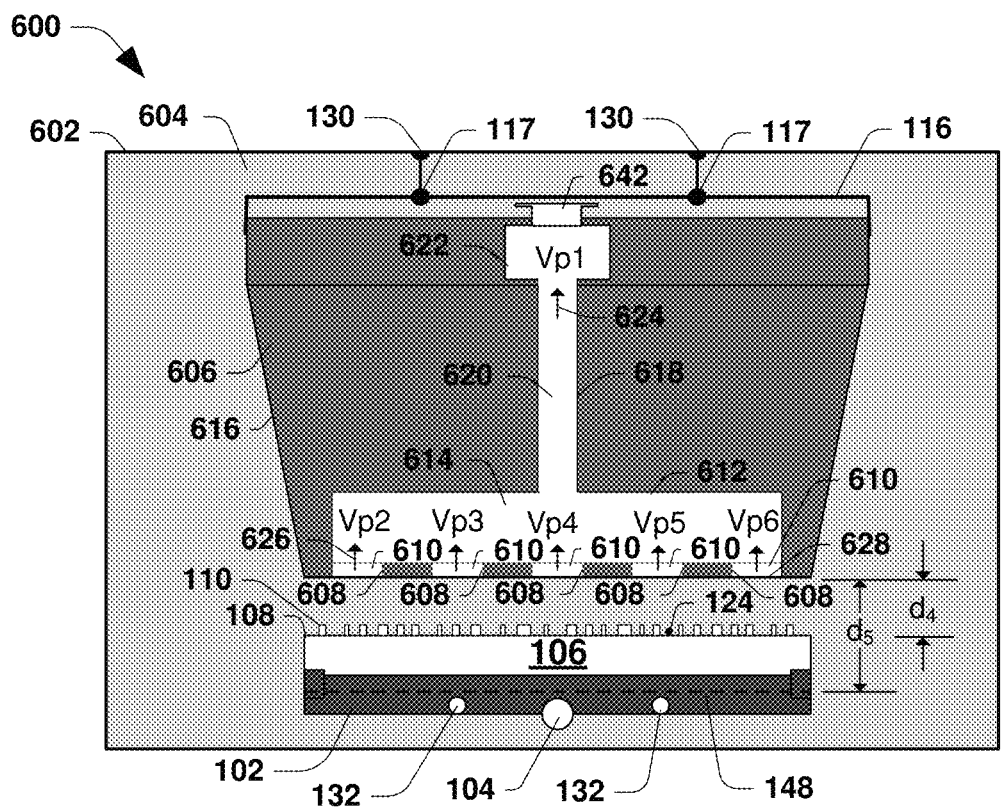
FIGS. 6-11 are illustrations of a cleaning apparatus for cleaning a surface of a photomask, according to some embodiments.

FIGS. 6-11 are illustrations of a cleaning apparatus for cleaning a surface of a photomask, according to some embodiments. In addition to depicting the cleaning apparatus, FIG. 6 depicts the photomask to provide context to features of the disclosed cleaning apparatus. The depiction of the photomask is not to be construed as a component and/or limitation of the disclosed cleaning apparatus.

Turning to FIG. 6, a cleaning apparatus 600 for cleaning the surface 108 of the photomask 106, such as by removing particles 124 or contaminants from the surface 108, may comprise at least one of the photomask holder 102 or the driver 104 as described with reference to the cleaning apparatus 100 of FIGS. 1-5. Therefore, descriptions of the photomask holder 102 and the driver 104 of the cleaning apparatus 600 are omitted to avoid repetition. Other configurations of the photomask holder 102 and/or the driver 104 of the cleaning apparatus 600 are within the scope of the present disclosure.

The cleaning apparatus 600 comprises a housing 602 defining a chamber 604. In some embodiments, the cleaning apparatus 600 comprises at least one of the mounting fixture 116, the mounting holes 117, the mounts 130, or the guide rods 132 as described with reference to the cleaning apparatus 100 of FIGS. 1-5. Therefore, descriptions of the housing 602, the mounting fixture 116, the mounting holes 117, the mounts 130, and the guide rods 132 of the cleaning apparatus 600 are omitted to avoid repetition. Other configurations of the housing 602, the mounting fixture 116, the mounting holes 117, the mounts 130, and/or the guide rods 132 of the cleaning apparatus 600 are within the scope of the present disclosure.

The cleaning apparatus 600 comprises a vacuum 606 disposed over the photomask holder 102. At least one of the photomask holder 102 or the vacuum 606 is coupled to a driver, such as driver 104, to generate relative movement between the photomask holder 102 and the vacuum 606 while the surface 108 is cleaned. In some embodiments, a rate of the relative movement between the photomask holder 102 and the vacuum 606 is 5 centimeters per second. Other configurations to generate relative movement between the photomask holder 102 and the vacuum 606 are within the scope of the present disclosure.

The vacuum 606 comprises a vacuum housing 616 having first surfaces 608 defining two or more vacuum pores 610, second surfaces 612 defining a vacuum chamber 614, and third surfaces 618 defining a vacuum conduit 620, according to some embodiments. The two or more vacuum pores 610 are hermetically coupled to the vacuum chamber 614. The vacuum chamber 614 is hermetically coupled to the vacuum conduit 620. And the vacuum conduit 620 is hermetically coupled to a vacuum pressure source 622. The vacuum pressure source 622 provides a first vacuum pressure Vp1 624 that draws gas from a region below the two or more vacuum pores 610, through the vacuum chamber 614 and the vacuum conduit 620, and to the vacuum pressure source 622. The vacuum pressure source 622 may include a filter (not shown) to capture particles, such as particles 124, suctioned off the surface 108 and through a vacuum pore of the two or more vacuum pores 610, the vacuum chamber 614, and the vacuum conduit 620. In some embodiments, the vacuum pressure source 622 comprises a hermetic coupler 642 to hermetically couple an external vacuum pressure source to the two or more vacuum pores 610 through one or more vacuum conduits. The hermetic coupler 642 may be directly coupled to the vacuum conduit 620, the vacuum chamber 614, or vacuum pores of the two or more vacuum pores 610. Other configurations of the vacuum housing 616 are within the scope of the present disclosure.

According to some embodiments, the first vacuum pressure Vp1 624 creates two or more second vacuum pressures Vp2-Vp6 626 at each pore of the two or more vacuum pores 610. The first vacuum pressure Vp1 624 may be divided among the two or more vacuum pores 610. In some embodiments, the first vacuum pressure Vp1 624 is divided equally among the pores of the two or more vacuum pores 610 such that the second vacuum pressure Vp2-Vp6 626 is $1/n^{th}$ the first vacuum pressure Vp1 624 at each pore of the two or more vacuum pores 610, where "n" is the number of vacuum pores. For example, FIG. 6 illustrates a vacuum 606 comprising five (n=5) vacuum pores. In this example, the second vacuum pressure Vp2-Vp6 626 at each pore is (Vp1)/5 torr. In some embodiments, the first vacuum pressure Vp1 624 is divided unequally among the pores of the two or more vacuum pores 610. For example, a vacuum pressure at one or more pores may be greater than a vacuum pressure at some other pores, such as by varying respective sizes of different vacuum pores. Other configurations for creating vacuum pressure(s) among the pores of the two or more vacuum pores 610 are within the scope of the present disclosure.

In the illustrated embodiment, the first vacuum pressure Vp1 624 may be set such that the second vacuum pressure Vp2-Vp6 626 (each (Vp1)/5 torr) is sufficient to draw up to the anticipated largest and/or anticipated heaviest particles 124 off the surface 108 and through a pore of the two or more vacuum pores 610. The vacuum pressure required to draw a particle 124 through a pore of the two or more vacuum pores 610 is based on the size and/or weight of the particle 124, and a distance $d_4$ from the surface 108 to a bottom surface 628 of the vacuum 606. The vacuum pressure required to draw a particle 124 off the surface 108 and into a vacuum pore of the two or more vacuum pores 410 at a distance $d_4$ may be based on the sum of a first force to overcome the Van der Waals force between the atoms and/or molecules at the surface 108 and the atoms and/or molecules of the particle 124, a second force to overcome the weight of the particle, and the distance $d_4$. If the vacuum pressure required to draw a particle 124 off the surface 108 and into a vacuum pore is M torr, then the first vacuum pressure Vp1 424 may be set at greater than or equal to 5·M torr. In some embodiments, the distance $d_4$ is within a range of 1-5 millimeters. In some embodiments, a distance $d_5$ from the bottom surface 628 of the vacuum 606 to the top surface 148 of the photomask holder is within a range of 2-8 millimeters. Other configurations for drawing a particle off the surface 108 and through a pore of the two or more vacuum pores 610 are within the scope of the present disclosure.

In some embodiments, the first vacuum pressure Vp1 624 may be distributed unequally among the pores of the two or more vacuum pores 610. For example, some pores of the two or more vacuum pores 610 may have a first diameter and other pores of the two or more vacuum pores 610 may have a second diameter different than the first diameter. If the first diameter is greater than the second diameter, the vacuum pressure per unit area of a pore of the second diameter may be greater than the vacuum pressure per unit area of a pore of the first diameter. Other configurations for unequally distributing the first vacuum pressure Vp1 624 among the two or more vacuum pores 610 are within the scope of the disclosure.

Figure 7:
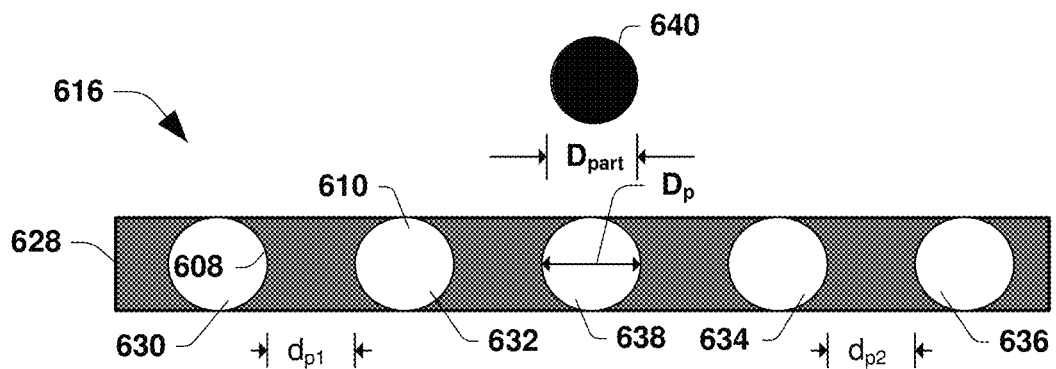

Referring to FIG. 7, the distance between two adjacent vacuum pores of the two or more vacuum pores 610 is $d_p$. According to some embodiments, $d_p$ is within a range of 3-8 millimeters. A first vacuum pore 630 of the two or more vacuum pores 610 may be separated from a second vacuum pore 632 of the two or more vacuum pores 610 by a first distance $d_{p1}$, and a third vacuum pore 634 of the two or more vacuum pores 610 may be separated from a fourth vacuum pore 636 of the two or more vacuum pores 610 by a second distance $d_{p2}$. The first distance $d_{p1}$ may be less than, equal to, or greater than the second distance $d_{p2}$. The second vacuum pore 632 may be the same vacuum pore or a different vacuum pore as the third vacuum pore 634. Other distances between vacuum pores are within the scope of the disclosure. For example, $d_p$ may be within a range of 3 millimeters to 8 millimeters for some adjacent vacuum pores and less than 3 millimeters or greater than 8 millimeters for other adjacent vacuum pores. Distances between vacuum pores can vary in any manner, such as based upon a layout of patterned areas 110 (FIG. 6) of the photomask 106. Although vacuum pores are generally disclosed as circular or having circular cross-sections, the instant application is not to be so limited. Vacuum pores can have any shape or cross-section, such as oval, quadrilateral, etc., such as based upon a layout of patterned areas 110 (FIG. 6) of the photomask 106. Shapes, sizes, and/or spacing between vacuum pores can vary among vacuum pores such as based upon a layout of patterned areas 110 (FIG. 6) of the photomask 106.

A diameter $D_p$ of at least one pore 638 of the two or more vacuum pores 610 is greater than a diameter $D_{part}$ of the largest particle 640 that may be drawn into a pore. In some embodiments, the diameter $D_{part}$ of the largest particle 640 to be drawn into a pore is 200 micrometers and the diameter $D_p$ of at least one pore 638 is within a range of 2-5 millimeters. Other diameters $D_{part}$ of the largest particle to be drawn into a pore and other diameters of at least one pore 638 to draw the largest particle 640 into the at least one pore are within the scope of the disclosure. For example, the diameter $D_p$ of some pores may be within the range of 2-5 millimeters and the diameter $D_p$ of other pores may be outside the range of 2-5 millimeters.

Figure 8:
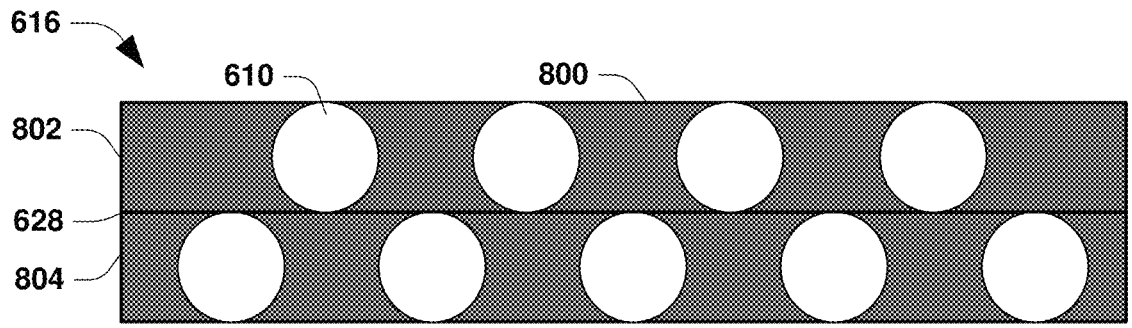

Turning to FIG. 8, vacuum pores of the two or more vacuum pores 610 are distributed in a two-dimensional array 800 along the bottom surface 628, according to some embodiments. The two-dimensional array 800 of vacuum pores comprises a first sub-array 802 of vacuum pores and a second sub-array 804 of vacuum pores. Pores of the first sub-array 802 of vacuum pores and pores of the second sub-array 804 of vacuum pores may be aligned with one another, staggered, or arranged in any other manner. Other configurations of arrays of vacuum pores are within the scope of the present disclosure.

Figure 9:
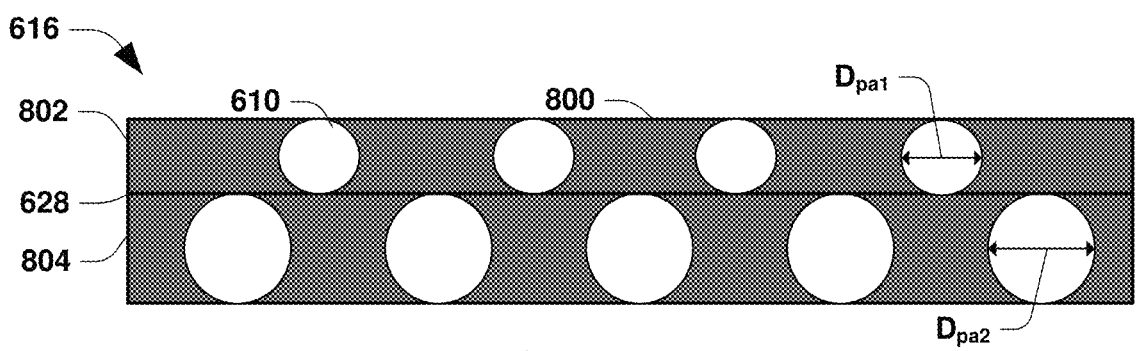

Turning to FIG. 9, at least some first diameters $D_{pa1}$ of vacuum pores of the first sub-array 802 can be different than at least some second diameters $D_{pa2}$ of vacuum pores of the second sub-array 804, according to some embodiments. At least some of the first diameters $D_{pa1}$ of vacuum pores of the first sub-array 802 may be less than, greater than, or equal to at least some of the second diameters $D_{pa2}$ of vacuum pores of the second sub-array 804. Other relative diameters of vacuum pores of the first sub-array 802 and vacuum pores of the second sub-array 804 are within the scope of the present disclosure.

Figure 10:
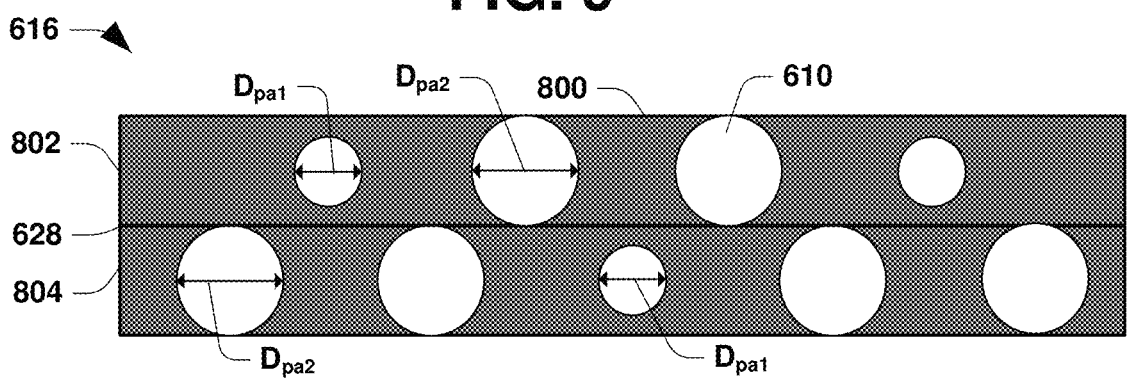

Turning to FIG. 10, some first diameters $D_{pa1}$ of vacuum pores of the first sub-array 802 are different than some second diameters $D_{pa2}$ of vacuum pores of the first sub-array 802, and/or some first diameters $D_{pa1}$ of vacuum pores of the second sub-array 804 are different than some second diameters $D_{pa2}$ of vacuum pores of the second sub-array 804, according to some embodiments. The first diameters $D_{pa1}$ of vacuum pores may be less than or greater than the second diameters $D_{pa2}$ of vacuum pores. Other relative diameters of vacuum pores within the first sub-array and/or vacuum pores within the second sub-array are within the scope of the present disclosure.

Figure 11:
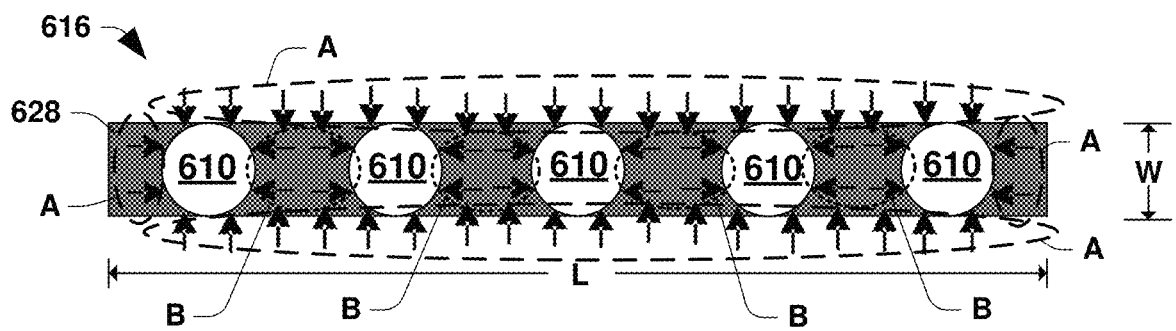

Turning to FIG. 11, compared to a vacuum having an entirely open bottom area (open-slit bottom having open area L·W), a vacuum having a bottom surface 628 comprising two or more vacuum pores 610 has greater vacuum flux, according to some embodiments. The flux generated by a vacuum having an open-slit bottom is represented by flux arrows "A". The flux generated by a vacuum comprising pores is represented by flux arrows "A" and "B". Thus, the disclosed vacuum 606 comprising two or more vacuum pores 610 has greater flux, and correspondingly greater vacuum force per unit area, than a vacuum having an open-slit bottom.

Figure 12:
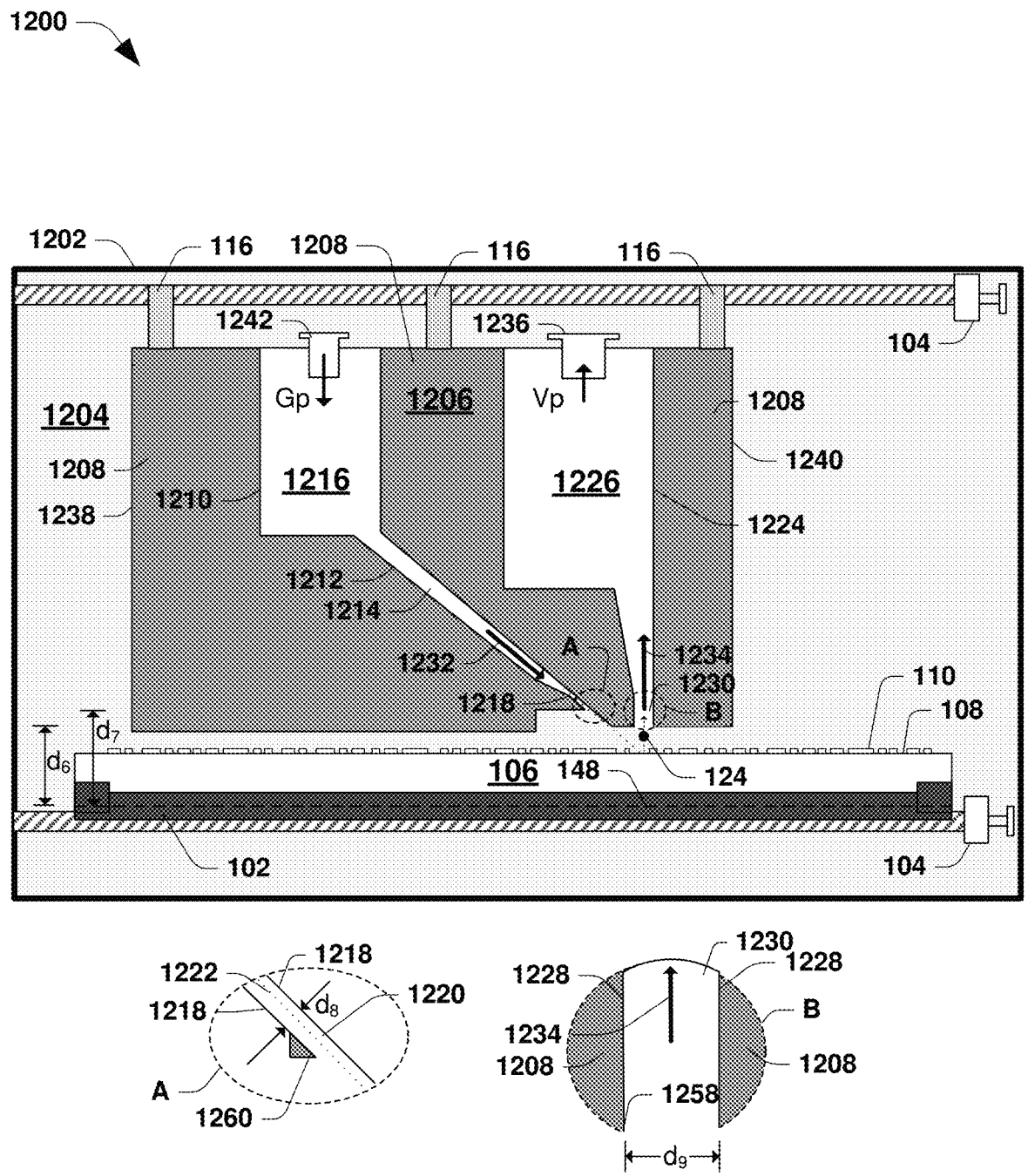
FIGS. 12-13 are illustrations of a cleaning apparatus for cleaning a surface of a photomask, according to some embodiments.
Figure 13:
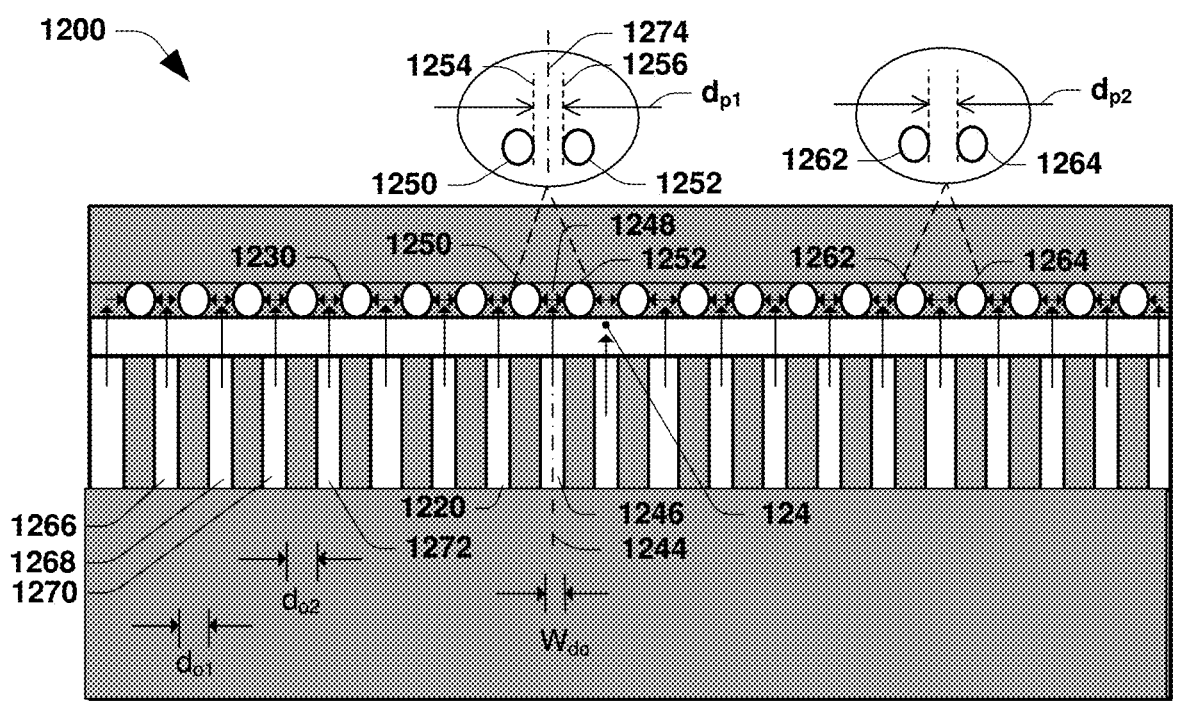

FIGS. 12-13 are illustrations of a cleaning apparatus for cleaning a surface of a photomask, according to some embodiments. In addition to depicting the cleaning apparatus, FIG. 12 depicts the photomask to provide context to features of the disclosed cleaning apparatus. The depiction of the photomask is not to be construed as a component and/or limitation of the disclosed cleaning apparatus.

Turning to FIG. 12, a cleaning apparatus 1200 for cleaning the surface 108 of the photomask 106, such as by removing particles 124 or contaminants from the surface 108, may comprise at least one of the photomask holder 102, one or more drivers 104, or the mounting fixture 116 as described with reference to the cleaning apparatus 100 of FIGS. 1-5. Therefore, descriptions of the photomask holder 102, the one or more drivers 104, and the mounting fixture 116 of the cleaning apparatus 1200 are omitted to avoid repetition. Other configurations of the photomask holder 102, the one or more drivers 104, and/or the mounting fixture 116 of the cleaning apparatus 1200 are within the scope of the present disclosure.

The cleaning apparatus 1200 comprises a housing 1202 defining a chamber 1204. A particle remover 1206 is disposed within the chamber 1204. The particle remover 1206 comprises a housing 1208 disposed over the photomask holder 102. The one or more drivers 104 are configured to generate a rate of relative movement between the photomask holder 102 and the particle remover 1206. According to some embodiments, the rate of relative movement is 5 centimeters per second. Other rates of relative movement between the photomask holder 102 and the particle remover 1206 are within the scope of the present disclosure.

The housing 1208 comprises first surfaces 1210 defining a gas chamber 1216 of a gas dispenser 1238, second surfaces 1212 defining a gas conduit 1214, third surfaces 1218 defining two or more gas dispensing outlets 1220 to direct a gas-knife 1222 in a direction 1232 of the surface 108, fourth surfaces 1224 defining a vacuum chamber 1226 of a vacuum 1240, and fifth surfaces 1228 defining two or more vacuum pores 1230 to direct gas and particles 124 in a direction 1234 of the vacuum chamber 1226. The gas-knife 1222 may comprise air or other gas or mixture of gasses. In some embodiments, the pressurized gas chamber 1216 is hermetically coupled to a gas source (not shown) via a first hermetic coupler 1242 and the vacuum chamber 1226 is hermetically coupled to an external vacuum pressure source (not shown) via a second hermetic coupler 1236. In some embodiments, the gas dispenser 1238 comprises at least one of the gas chamber 1216, the gas conduit 1214, or the two or more gas dispensing outlets 1220. In some embodiments, the vacuum 1240 comprises at least one of the vacuum chamber 1226 or the two or more vacuum pores 1230. Other configurations of the gas dispenser 1238 and/or the vacuum 1240 are within the scope of the present disclosure.

To clean the surface 108, the two or more gas dispensing outlets 1220 direct the gas-knife 1222 in the direction 1232 of the surface 108. In some embodiments, the gas-knife 1222 provides a gas-knife force to displace the particle 124 from the surface 108 and the vacuum chamber 1226 provides a vacuum force to draw the displaced particle 124 into a vacuum pore of the two or more vacuum pores 1230. In some embodiments, the gas-knife force alone is sufficient to overcome the Van der Waals adhesion force between molecules and/or atoms of the surface 108 and molecules and/or atoms of the particle 124. In some embodiments, the gas-knife force combined with the vacuum force is sufficient to overcome the Van der Waals adhesion force between the particle 124 and the surface 108. In some embodiments, the vacuum force alone is sufficient to overcome the Van der Waals adhesion force between the particle 124 and the surface 108. At least one of at least one vacuum pore of the two or more vacuum pores 1230, the vacuum chamber 1226, the second hermetic coupler 1236, or the external vacuum pressure source may include a filter (not shown) to capture particles, such as particle 124, drawn off the surface 108 of the photomask 106.

A bottom portion 1258 of the fifth surfaces 1228 nearest the top surface 148 of the photomask holder 102 is separated a first distance ($d_6$) from the top surface of the photomask holder, and a bottom portion 1260 of the third surfaces 1218 nearest the top surface 148 of the photomask holder 102 is separated a second distance ($d_7$) from the top surface 148 of the photomask holder 102. In some embodiments the first distance is equal to the second distance. In some embodiments the first distance is different than the second distance. In some embodiments, the first distance is less than the second distance. In some embodiments, the first distance is greater than the second distance. In some embodiments, the first distance $d_6$ is within a range of 2-50 millimeters. In some embodiments, the second distance $d_7$ is within a range of 2-50 millimeters. In some embodiments, a width $d_8$ of the gas dispensing outlet 1220 is 0.5 millimeters and a width d9 of a vacuum pore of the two or more vacuum pores 1230 is within a range of 2-5 millimeters. Other configurations and/or dimensions of features of the particle remover 1206 are within the scope of the present disclosure.

FIG. 13 is a bottom plan view of the particle remover 1206. FIG. 13 illustrates the two or more vacuum pores 1230 and the two or more gas dispensing outlets 1220. In some embodiments, a centerline 1244 of a gas dispensing outlet 1246 of the two or more gas dispensing outlets 1220 is aligned with an area 1248 between a first vacuum pore 1250 of the two or more vacuum pores and a second vacuum pore 1252 of the two or more vacuum pores 1230. A first boundary of the area 1248 between the first vacuum pore 1250 of the two or more vacuum pores and the second vacuum pore 1252 of the two or more vacuum pores may be aligned with a vertical margin 1254 of the first vacuum pore 1250, and a second boundary of the area between the first vacuum pore of the two or more vacuum pores and the second vacuum pore of the two or more vacuum pores may be aligned with a vertical margin 1256 of the second vacuum pore 1252. In some embodiments, the centerline 1244 of the gas dispensing outlet 1246 is aligned with a centerline 1274 between the vertical margin 1254 of the first vacuum pore 1250 and the vertical margin 1256 of the second vacuum pore 1252. In some embodiments, the centerline 1244 of the gas dispensing outlet 1246 is aligned with a line other than the centerline 1274 between the vertical margin 1254 of the first vacuum pore 1250 and the vertical margin 1256 of the second vacuum pore 1252. In some embodiments, the centerline 1244 of the gas dispensing outlet 1246 is aligned with a point within a pore of the two or more vacuum pores 1230.

In some embodiments, the first vacuum pore 1250 is separated from the second vacuum pore 1252 by a first distance ($d_{p1}$) and a third vacuum pore 1262 of the two or more vacuum pores 1230 is separated from a fourth vacuum pore 1264 of the two or more vacuum pores 1230 by a second distance ($d_{p2}$). The first distance $d_{p1}$ may be greater than, less than, or equal to the second distance $d_{p2}$. In some embodiments, the second vacuum pore 1252 and the third vacuum pore 1262 are the same vacuum pore.

In some embodiments, a first gas dispensing outlet 1266 of the two or more gas dispensing outlets 1220 is separated from a second gas dispensing outlet 1268 of the two or more gas dispensing outlets 1220 by a first distance ($d_{o1}$), and a third gas dispensing outlet 1270 of the two or more gas dispensing outlets 1220 is separated from a fourth gas dispensing outlet 1272 of the two or more gas dispensing outlets 1220 by a second distance ($d_{o2}$). The first distance $d_{o1}$ may be great than, less than, or equal to the second distance $d_{o2}$. In some embodiments, the second gas dispensing outlet 1268 and the third gas dispensing outlet 1270 are the same gas dispensing outlet. In some embodiments, a width ($W_{do}$) of at least one of the gas dispensing outlets is equal to or less than 0.5 millimeters. In some embodiments, the width $W_{do}$ of at least one of the gas dispensing outlets is greater than 0.5 millimeters. Other arrangements of the two or more gas dispensing outlets 1220 and/or the two or more vacuum pores 1230 are within the scope of the present disclosure.

The cleaning apparatus of the disclosure includes a gas dispenser, a vacuum, or a particle remover having both a gas dispenser and a vacuum. Because the gas dispenser dispenses gas-knives to displace particle(s) in a forward direction, the cleaning apparatus of the disclosure has less potential to damage the surface of a photomask compared to other photomask cleaning apparatuses such as wet-clean devices. Because the vacuum creates vacuum pressure flux into two or more vacuum pores, the cleaning apparatus of the disclosure is more effective at suctioning particles off the surface of a photomask compared to other photomask cleaning apparatuses such as a vacuum having a single open vacuum slit. Because the particle remover includes both a gas dispenser and a vacuum, a particle removal force is greater than other photomask cleaners such as wet-clean devices or single open slit vacuums.

A cleaning apparatus for cleaning a surface of a photomask includes a housing defining a chamber, a photomask holder disposed within the chamber, and a gas dispenser disposed within the chamber to direct gas toward the photomask holder. The gas dispenser has two or more gas dispensing outlets. A driver is coupled to at least one of the photomask holder or the gas dispenser to establish relative movement between the photomask holder and the gas dispenser.

A cleaning apparatus for cleaning a surface of a photomask includes a housing defining a chamber, a photomask holder disposed within the chamber, and a vacuum disposed within the chamber to establish vacuum relative to the photomask holder. The vacuum has surfaces defining two or more vacuum pores. A driver is coupled to at least one of the photomask holder or the vacuum to establish relative movement between the photomask holder and the vacuum.

A cleaning apparatus for cleaning a surface of a photomask includes a housing defining a chamber, a photomask holder disposed within the chamber, a gas dispenser disposed within the chamber to direct a gas-knife toward the photomask holder, and a vacuum disposed within the chamber to establish vacuum relative to the photomask holder. The vacuum includes two or more vacuum pores, the gas dispenser includes two or more gas dispensing outlets, and a first centerline of a gas dispensing outlet of the two or more gas dispensing outlets is aligned with an area between a first vacuum pore of the two or more vacuum pores and a second vacuum pore of the two or more vacuum pores.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A cleaning apparatus for cleaning a surface of a photomask, comprising:
   a housing defining a chamber;
   a photomask holder disposed within the chamber;
   a gas dispenser over the photomask holder and disposed within the chamber to direct a gas-knife toward the photomask holder, the gas dispenser comprising two or more gas dispensing outlets, a first gas dispensing outlet of the two or more gas dispensing outlets directing gas over a first portion of the photomask holder and a second gas dispensing outlet of the two or more gas dispensing outlets directing gas over a second portion of the photomask holder partially overlapping the first portion of the photomask holder; and a vacuum disposed within the chamber to establish vacuum relative to the photomask holder, wherein:
the vacuum comprises two or more vacuum pores,
the two or more gas dispensing outlets are stacked in a first direction, and
a first centerline, extending in a second direction different than the first direction, of the first gas dispensing outlet is aligned with an area between a first vacuum pore of the two or more vacuum pores and a second vacuum pore of the two or more vacuum pores.

2. The cleaning apparatus of claim 1, wherein:
a first boundary of the area between the first vacuum pore of the two or more vacuum pores and the second vacuum pore of the two or more vacuum pores is aligned with a vertical margin of the first vacuum pore, and
a second boundary of the area between the first vacuum pore of the two or more vacuum pores and the second vacuum pore of the two or more vacuum pores is aligned with a vertical margin of the second vacuum pore.

3. The cleaning apparatus of claim 1, wherein:
the vacuum comprises a first surface defining the first vacuum pore,
the gas dispenser comprises a second surface defining the first gas dispensing outlet,
a bottom portion of the first surface nearest a top surface of the photomask holder is separated a first distance from the top surface of the photomask holder,
a bottom portion of the second surface nearest the top surface of the photomask holder is separated a second distance from the top surface of the photomask holder, and
the first distance is different than the second distance.

4. The cleaning apparatus of claim 1, wherein:
the first vacuum pore is separated from the second vacuum pore by a first distance,
a third vacuum pore of the two or more vacuum pores is separated from a fourth vacuum pore of the two or more vacuum pores by a second distance, and
the first distance is equal to the second distance.

5. The cleaning apparatus of claim 1, wherein:
the first gas dispensing outlet is separated from the second gas dispensing outlet by a first distance,
a third gas dispensing outlet of the two or more gas dispensing outlets is separated from a fourth gas dispensing outlet of the two or more gas dispensing outlets by a second distance, and
the first distance is equal to the second distance.

6. The cleaning apparatus of claim 1, wherein a width of the first gas dispensing outlet is less than 0.5 millimeters.

7. The cleaning apparatus of claim 1, wherein the vacuum overlies the photomask holder.

8. The cleaning apparatus of claim 1, comprising:
a driver coupled to the photomask holder for moving the photomask holder relative to the gas dispenser and the vacuum.

9. The cleaning apparatus of claim 8, wherein a rate of relative movement between the photomask holder and the vacuum is 5 centimeters per second.

10. The cleaning apparatus of claim 1, wherein:
the first gas dispensing outlet comprises a first surface defining a gas dispensing conduit, and
an angle of the first surface relative to a top surface of the photomask holder is within a range of 30 degrees to 60 degrees.

11. The cleaning apparatus of claim 1, wherein:
the first gas dispensing outlet comprises a first surface and a second surface defining a gas dispensing conduit,
a first angle of the first surface relative to a top surface of the photomask holder is greater than 30 degrees,
a second angle of the second surface relative to the top surface of the photomask holder is less than 60 degrees, and
the second angle is different than the first angle.

12. The cleaning apparatus of claim 1, wherein a velocity of gas dispensed from the first gas dispensing outlet is within a range of 10 meters-per-second to 20 meters-per-second.

13. The cleaning apparatus of claim 1, wherein a distance between the first vacuum pore and the second vacuum pore of the two or more vacuum pores is within a range of 3 millimeters to 8 millimeters.

14. The cleaning apparatus of claim 1, wherein a diameter of the first vacuum pore is within a range of 2 millimeters to 5 millimeters.

15. The cleaning apparatus of claim 1, wherein surfaces of the vacuum defining the two or more vacuum pores define a two-dimensional matrix of vacuum pores.

16. A cleaning apparatus for cleaning a surface of a photomask, comprising:
a housing defining a chamber;
a photomask holder disposed within the chamber;
a gas dispenser disposed within the chamber to direct gas toward the photomask holder and comprising two or more gas dispensing outlets, a first gas dispensing outlet of the two or more gas dispensing outlets directing gas over a first portion of the photomask holder and a second gas dispensing outlet of the two or more gas dispensing outlets directing gas over a second portion of the photomask holder partially overlapping the first portion of the photomask holder;
a vacuum disposed within the chamber to establish vacuum relative to the photomask holder, wherein the vacuum comprises two or more vacuum pores; and
a driver coupled to at least one of the photomask holder or the gas dispenser to establish relative movement between the photomask holder and the gas dispenser.

17. The cleaning apparatus of claim 16, wherein:
the driver is coupled to the photomask holder, and
the driver comprises a threaded shaft extending through the photomask holder to facilitate movement of the photomask holder.

18. The cleaning apparatus of claim 16, wherein the gas dispenser comprises a mounting fixture for mounting the gas dispenser to the housing.

19. A cleaning apparatus for cleaning a surface of a photomask, comprising:
a housing defining a chamber;
a photomask holder disposed within the chamber;
a gas dispenser disposed within the chamber to direct a gas-knife toward the photomask holder, the gas dispenser comprising two or more gas dispensing outlets, a first gas dispensing outlet of the two or more gas dispensing outlets directing gas over a first portion of the photomask holder and a second gas dispensing outlet of the two or more gas dispensing outlets directing gas over a second portion of the photomask holder partially overlapping the first portion of the photomask holder;

a vacuum disposed within the chamber to establish vacuum relative to the photomask holder, wherein the vacuum comprises surfaces defining two or more vacuum pores; and a driver coupled to at least one of the photomask holder or the vacuum to establish relative movement between the photomask holder and the vacuum, wherein the two or more gas dispensing outlets are offset from the two or more vacuum pores in a first direction perpendicular to a second direction of the relative movement.

20. The cleaning apparatus of claim 19, wherein the surfaces define a two-dimensional matrix of vacuum pores.

\* \* \* \* \*